(12) United States Patent
Sturland et al.

(10) Patent No.: US 12,169,359 B2
(45) Date of Patent: Dec. 17, 2024

(54) MANUFACTURE OF SURFACE RELIEF STRUCTURES

(71) Applicant: Snap Inc., Santa Monica, CA (US)

(72) Inventors: Ian Sturland, Filton Bristol (GB); Mark Venables, Filton Bristol (GB); Tracey Hawke, Filton Bristol (GB); Rory Mills, Rochester Kent (GB); Ian Macken, Rochester Kent (GB)

(73) Assignee: Snap Inc., Santa Monica, CA (US)

( * ) Notice: Subject to any disclaimer, the term of this patent is extended or adjusted under 35 U.S.C. 154(b) by 115 days.

(21) Appl. No.: 17/753,096

(22) PCT Filed: Aug. 20, 2020

(86) PCT No.: PCT/GB2020/051997
§ 371 (c)(1),
(2) Date: Feb. 18, 2022

(87) PCT Pub. No.: WO2021/032983
PCT Pub. Date: Feb. 25, 2021

(65) Prior Publication Data
US 2022/0342297 A1 Oct. 27, 2022

(30) Foreign Application Priority Data

Aug. 21, 2019 (GB) .................................. 1911981
Nov. 28, 2019 (EP) .................................. 19275136

(51) Int. Cl.
*G03F 7/00* (2006.01)
*B05C 3/02* (2006.01)
(Continued)

(52) U.S. Cl.
CPC .............. *G03F 7/001* (2013.01); *B05C 3/02* (2013.01); *B05D 1/18* (2013.01); *B81C 1/00523* (2013.01);
(Continued)

(58) Field of Classification Search
None
See application file for complete search history.

(56) References Cited

U.S. PATENT DOCUMENTS

| 908,790 A | 1/1909 | Mallam |
| 5,648,643 A * | 7/1997 | Knowles ............... G06F 3/0436 345/177 |

(Continued)

FOREIGN PATENT DOCUMENTS

| BR | 112022003132 | 5/2022 |
| EP | 2752691 A1 | 7/2014 |

(Continued)

OTHER PUBLICATIONS

International Preliminary Report on Patentability received for PCT/GB2020/051997. Mail Date: Mar. 3, 2022. 8 pages.
(Continued)

*Primary Examiner* — Jiong-Ping Lu
(74) *Attorney, Agent, or Firm* — Schwegman Lundberg & Woessner, P.A.

(57) ABSTRACT

A method and apparatus for the etching of variable depth features in a substrate is described. Movement of the substrate relative to an etchant (e.g. into or out of the etchant) during the etching process is utilised to provide a varying etch time, and hence depth, across the substrate, and in various examples this is enabled without requiring a varying mask.

18 Claims, 10 Drawing Sheets

(51) Int. Cl.
    B05D 1/18 (2006.01)
    B81C 1/00 (2006.01)
    G02B 5/18 (2006.01)
(52) U.S. Cl.
    CPC ...... B81C 1/00539 (2013.01); B81C 1/00555 (2013.01); B81C 1/00626 (2013.01); B81C 1/00634 (2013.01); G02B 5/1857 (2013.01)

(56) References Cited

U.S. PATENT DOCUMENTS

| | | | |
|---|---|---|---|
| 7,049,228 | B2 | 5/2006 | Baier et al. |
| 7,189,628 | B1 | 3/2007 | Mirbedini et al. |
| 8,853,091 | B2 | 10/2014 | Sato et al. |
| 2002/0127497 | A1* | 9/2002 | Brown ............... G02B 1/02 359/566 |
| 2016/0033697 | A1 | 2/2016 | Sainiemi et al. |
| 2016/0033784 | A1 | 2/2016 | Levola et al. |
| 2018/0095201 | A1 | 4/2018 | Melli et al. |
| 2020/0284967 | A1 | 9/2020 | Schowengerdt et al. |
| 2022/0246636 | A1 | 8/2022 | Tobioka et al. |

FOREIGN PATENT DOCUMENTS

| | | | |
|---|---|---|---|
| EP | 2752691 | * 9/2014 | ............... G02B 5/18 |
| EP | 3477347 A1 | 5/2019 | |
| EP | 4018230 | 6/2022 | |
| GB | 2589685 | 6/2021 | |
| IL | 290758 | 4/2022 | |
| JP | 2003207905 | 7/2003 | |
| KR | 20220046664 | 4/2022 | |
| WO | 2010094441 | 8/2010 | |
| WO | 2021032983 A1 | 2/2021 | |
| WO | WO-2023234953 A1 | 12/2023 | |
| WO | 2024111419 | 5/2024 | |

OTHER PUBLICATIONS

"United Kingdom Application Serial No. 2012984.7, Subsequent Examination Report under Section 18 (3) mailed May 17, 2022", 3 pgs.
"United Kingdom Application Serial No. 2012984.7, Subsequent Examination Report under Section 18(3) mailed Dec. 20, 2021", 2 pgs.
"United Kingdom Application Serial No. 2012984.7, Response filed Apr. 19, 2022 to Examination Report under Section 18 (3) mailed Dec. 20, 2021", 19 pgs.
"United Kingdom Application Serial No. 2012984.7, Combined Search and Examination Report under Section 17 and 18(3) mailed Feb. 10, 2021", 4 pgs.
"United Kingdom Application Serial No. 2012984.7, Response filed Oct. 20, 2021 to Examination Report mailed Feb. 10, 2021", 5 pgs.
"European Application Serial No. 20761879.4, Response to Communication pursuant to Rules 161 and 162 filed Sep. 15, 2022", 8 pgs.
"United Kingdom Application Serial No. 2012984.7, Response filed Sep. 15, 2022 to Subsequent Examination Report under Section 18 (3) mailed May 17, 2022", 9 pgs.
"Israel Application Serial No. 290758, Notification Prior to Examination mailed Oct. 27, 2022", 3 pgs.
International Search Report and Written Opinion received for PCT Application No. PCT/GB2020/051997. Mail date: Oct. 29, 2020. 9 pages.
GB Search Report under Section 17(5) received for GB Application No. 1911981.7, dated Feb. 12, 2020. 3 pages.
Extended European Search Report received for EP Application No. 19275136.0 dated May 27, 2020. 8 pages.
"Israel Application Serial No. 290758, Office Action mailed Aug. 7, 2024", 4 pgs.

* cited by examiner (a)

(b)

(a)

(b)

MANUFACTURE OF SURFACE RELIEF STRUCTURES

CLAIM OF PRIORITY

This application is a U.S. national-phase application filed under 35 U.S.C. § 371 from International Application Serial No. PCT/GB2020/051997, filed Aug. 20, 2020, and published as WO 2021/032983 on Feb. 25, 2021, which claims the benefit of priority to United Kingdom Patent Application Serial No. 1911981.7, filed Aug. 21, 2019, and European Patent Application Serial No. 19275136.0, filed Nov. 28, 2019, each of which is incorporated herein by reference in its entirety.

Optical gratings are components having a repeating pattern of lines with which light propagating in the component, or impingent on it, interacts. The grating causes diffraction of the light such that its direction of propagation may be altered. Gratings may operate in a transmissive or reflective mode.

Typically lines of a grating are formed by physical features on the surface of a component, for example by etching the surface of the material, and hence optical gratings formed in this way are examples of surface relief structures. In various examples, a grating within a component may be formed by creating a grating (i.e. a surface relief structure) on the surface of a first part and joining that part to a second part so that the grating is within the resulting component.

There are many applications for surface relief structures and for optical gratings in particular. An example application of optical gratings is in Head Up, or Head Mounted Displays (HUDs or HMDs) or other head-worn displays which overlay an image on the user's view of the real world. This is achieved by providing a transparent component in the user's line of sight which projects the required image to the user's eyes. Depending upon the configuration the transparent component may be on a helmet or may otherwise be head-worn (e.g. in a HMD) or the transparent component may be mounted in the vehicle (e.g. aeroplane or land vehicle) in which the user sits (e.g. in a HUD). Optical gratings may be utilised to couple light into, and out of, the transparent component. FIG. 1 shows schematic cross-section of a typical configuration of an optical waveguide 10 for a HUD. The configuration within a HMD may be similar to that shown in FIG. 1. Image light is injected at point 11, and diffracted by optical grating 12 such that the light travels at angle that will be guided by total internal reflection in the waveguide 10. The light is then coupled out of the waveguide by optical grating 13 to a user's eye 14.

To accommodate variations in alignment of the waveguide 10 and user's eye 14 the light should be coupled out of the waveguide over an area of an exit pupil as represented by rays 15, 16 at the edges of that pupil. The image intensity across the exit pupil should be constant such that any movement between the eye and waveguide does not cause a change in intensity. However, an output grating 13 with constant efficiency does not provide such even Intensity. As shown in FIG. 2a a constant-efficiency grating couples same portion of light out of the grating at all points. Hence the actual light intensity coupled out decreases along the length of the grating as shown in FIG. 2b.

This variation can be avoided by utilising a variable efficiency grating whereby the portion of light coupled out varies along the grating as shown in FIG. 3a. The variation in grating efficiency provides a constant output intensity as shown in FIG. 3b.

It will be appreciated that the graphs shown in FIGS. 2 and 3 are for illustration only and have been simplified for this purpose—in practical implementations, the graphs may be more complex (e.g. they may not be straight lines).

Present manufacturing techniques for variable efficiency gratings are complex and difficult to implement as they can involve use of optical coatings that vary in thickness over the area of the gratings, e.g. as shown in FIG. 4. The thicker coating layer at the right of the grating provides increased diffractive efficiency. However, producing a graduated thickness coating layer requires additional manufacturing steps, including the design and manufacture of a suitably shaped coating mask, which adds cost and complexity to the manufacturing process.

The embodiments described below are not limited to implementations which solve any or all of the disadvantages of known methods of manufacturing surface relief structures.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A method and apparatus for the etching of variable depth features in a substrate is described. Movement of the substrate relative to an etchant (e.g. into or out of the etchant) during the etching process is utilised to provide a varying etch time, and hence depth, across the substrate, and in various examples this is enabled without requiring a varying mask.

A first aspect provides a method of etching a surface relief structure in a substrate, the method comprising the steps of: moving the substrate between a first position and a second position in an etching system; wherein in the first position only a first part of the area to be etched is exposed to an etchant, and in the second position the whole area to be etched is exposed to the etchant such that the first part of the area to be etched is exposed to the etchant for a longer period of time than at least one other part of the whole area to be etched; and wherein the movement is defined according to the etching profile required, and removing the substrate from the etching fluid when etching is complete.

The surface relief structure may comprise a blazed surface relief structure.

The etchant may comprise an anisotropic etchant.

Moving the substrate between the first position and the second position in the etching system may comprise either moving the substrate from the first position to the second position or moving the substrate from the second position to the first position.

The surface relief structure may comprise a variable depth etching profile.

In various examples, both the movement of the substrate and an orientation of the substrate relative to the etchant surface may be defined according to the etching profile required.

The method may further comprise, prior to moving the substrate between the first position and the second position: preparing a substrate to be etched with an etch-resist mask. The method may additionally, further comprise, after removing the substrate from the etchant: removing any remaining etch-resist mask from the substrate.

The movement between the first position and the second position may be along an axis substantially perpendicular to a surface of the etchant.

The etch profile may be a non-linear profile.

The movement between the first position and the second position may comprise a series of discrete steps. In various examples, step may be the same size. In other examples, the steps are of varying sizes. The time between each step may be constant or the time between each step may be variable.

The movement between the first position and the second position may comprise a continuous movement. In various examples, the continuous movement may be at a constant speed. In other examples, the continuous movement may be at a variable speed.

The surface relief structure may be an optical grating. In various examples, the axis of movement may be aligned with the axis of the grating.

The surface relief structure may be an array of facets.

The resulting structure with the surface relief structure may be an optical master.

The substrate may be a substrate formed of a crystalline material. In various examples, the substrate may be a silicon wafer. In various examples, the substrate is an off-axis silicon wafer.

The substrate may be suspended by a suspension apparatus into an etching vessel. The substrate may be moved between the first position and the second position by the suspension apparatus lowering the substrate into the etching vessel of the etching system.

Moving the substrate between the first position and the second position in the etching system may be the first time the substrate is etched, such that the substrate is un-etched immediately prior to moving the substrate between a first position and a second position in the etching system.

A second aspect provides an etching system for etching a surface relief structure in a substrate comprising: an etching vessel; and a support apparatus arranged to move the substrate between a first position and a second position in the etching system; wherein in the first position only a first part of the area to be etched is exposed to an etchant in the etching vessel, and in the second position the whole area to be etched is exposed to the etchant such that the first part of the area to be etched is exposed to the etchant for a longer period of time than at least one other part of the whole area to be etched; and wherein the movement is defined according to the etching profile required.

The surface relief structure may comprise a blazed surface relief structure.

The etchant may comprise an anisotropic etchant.

The support apparatus may comprise a suspension apparatus arranged to move the substrate between the first position and the second position in the etching system by lowering the substrate into the etching vessel or by raising the substrate out of the etching vessel.

BRIEF DESCRIPTION OF THE DRAWINGS

Embodiments of the invention will be described, by way of example, with reference to the following drawings, in which.

DETAILED DESCRIPTION

Figure 1:
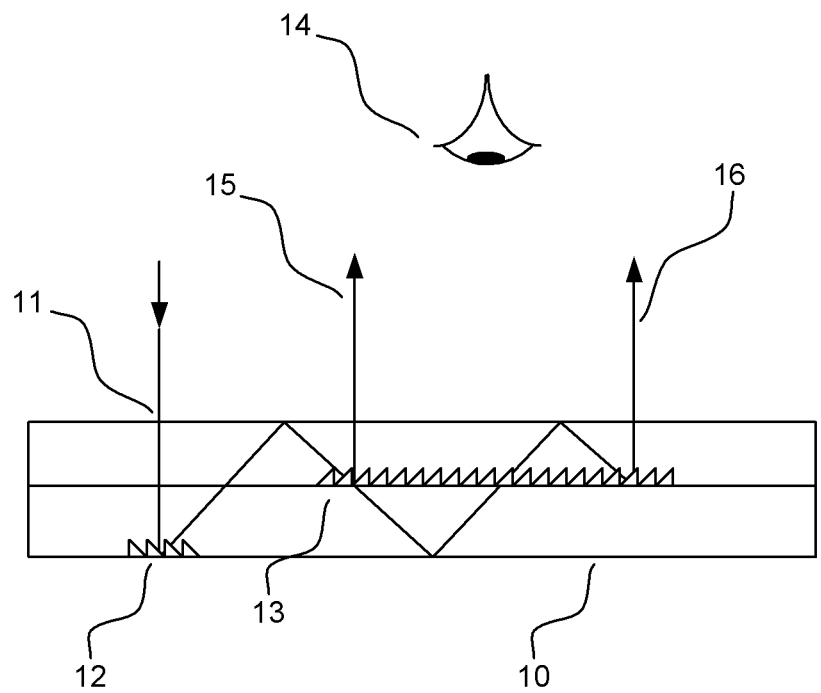
FIG. 1 shows a schematic diagram of a waveguide for a Head Up Display.
Figure 2:
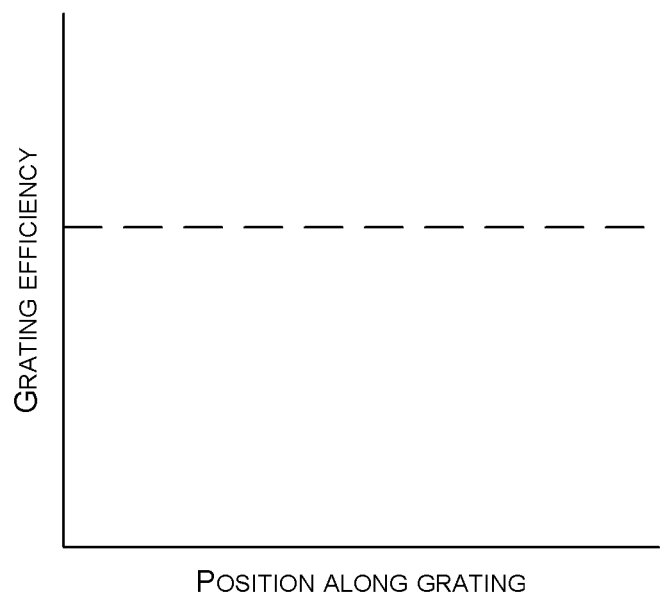
FIGS. 2 and 3 show charts of grating properties.
Figure 2:
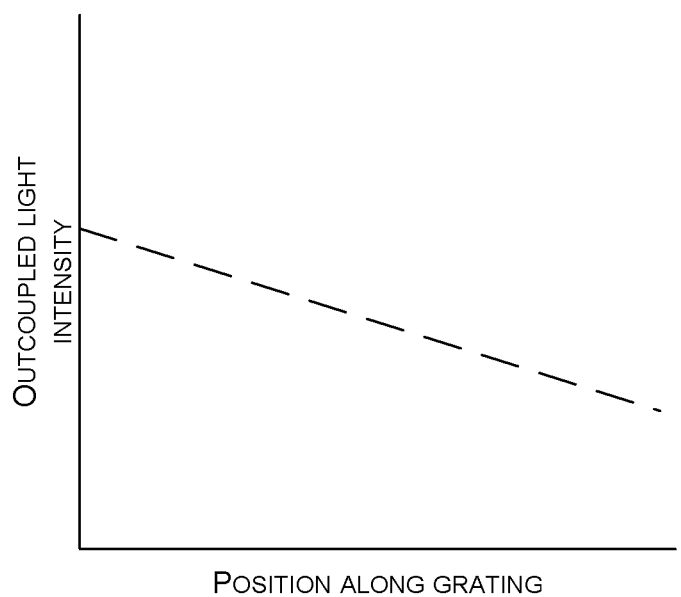
Figure 3:
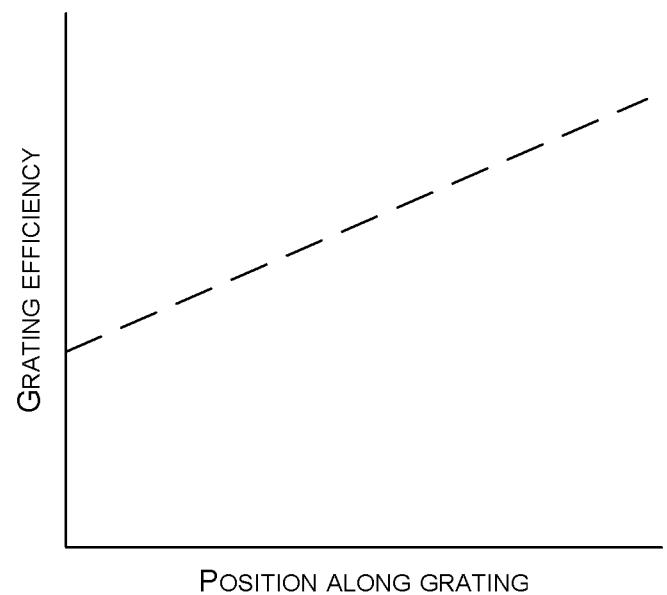
Figure 3:
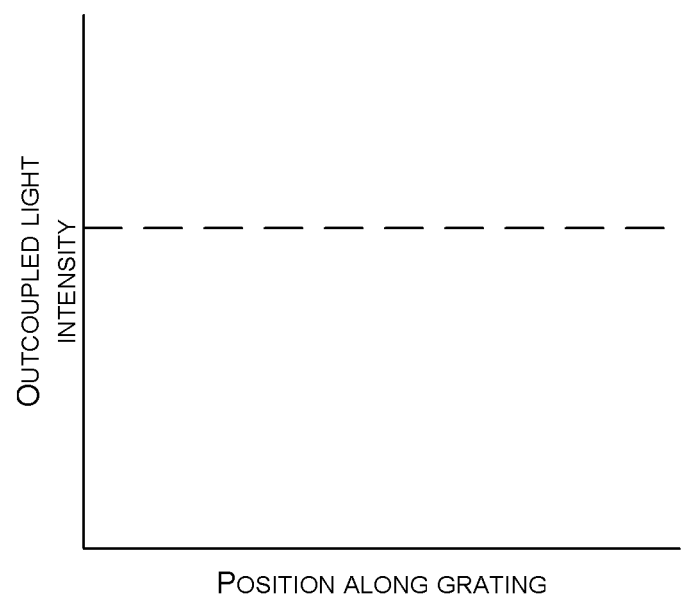
Figure 4:
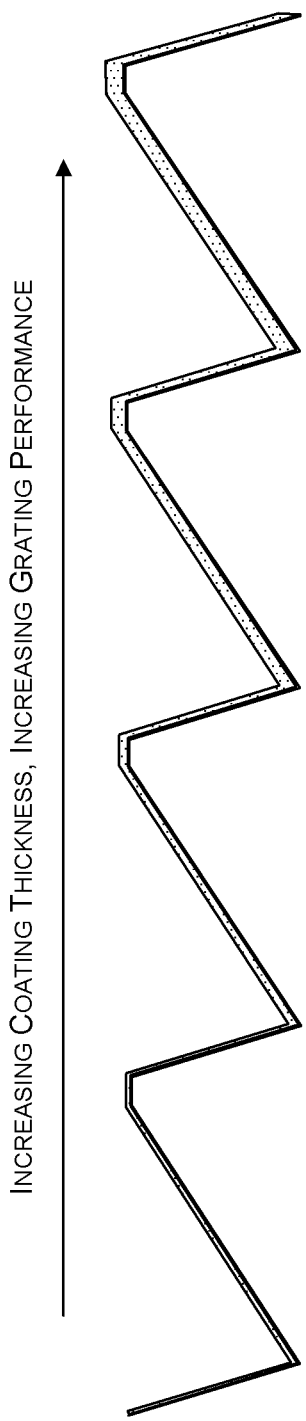
FIG. 4 shows a variable thickness coating.

Further details, aspects and embodiments of the invention will now be described, by way of example only, with reference to the drawings. Elements in the figures are illustrated for simplicity and clarity and have not necessarily been drawn to scale. Like reference numerals have been included in the respective drawings to ease understanding.

The following disclosure sets out a new method for producing surface relief structures on a substrate. Depending upon the size of features of the surface relief structure, the structure may be a nanostructure or alternatively the features may be on a larger scale (e.g. features that are tens or hundreds of microns wide and/or deep).

The surface relief structures may comprise an array of facets which may, for example, form an optical component that may be used for diffraction (e.g. optical gratings, such as a graded optical grating), reflection (e.g. mirror arrays) or refraction (e.g. prismatic arrays) or any combination thereof. In various examples, the surface relief structure may form an optical master which is then replicated (e.g. by moulding) to form a plurality of identical optical elements (e.g. copies of the optical master). The optical components formed using the surface relief structures (or comprising the surface relief structures) may be used in HUDs, HMDs or other head-worn displays (e.g. to provide a more uniform intensity across a display). The facets may be blazed.

The substrate in which the surface relief structure is formed by means of a wet etch, as described in detail below, may be formed from a crystalline material, such as silicon, or a non-crystalline material, such as glass or metal. In examples where the substrate is formed from a crystalline material (e.g. silicon), the etching may preferentially etch along some crystal planes. For example, where the substrate is silicon, it may be an off-axis silicon wafer (or part thereof), such as a wafer with a <100> orientation top plane where the etching exposes the {111} planes within the silicon. These exposed planes may form the facets of an array of facets or grating lines within the surface relief structure. A silicon wafer is an example of a semiconductor wafer and in various examples, the substrate may be another type of semiconductor wafer.

The etchant (or etching liquid) used may be any suitable liquid. In an example the substrate may be a semiconductor wafer, for example silicon, and the etchant may be any liquid known for etching such wafers (e.g. acids such as hydrofluoric acid, HF, or buffered HF, nitric acid, or strongly alkaline solutions).

As described in more detail below, the method comprises gradually inserting the substrate into or removing the substrate from the etchant, such that different parts of the substrate are etched for different amounts of time. This results in a controlled variation in etch depth across the resulting surface relief structure, which is proportional to the time spent within the etchant.

For the purposes of the following description, any reference to 'a part' of a substrate or area to be etched, refers to a part that is smaller than the entirety of the substrate or area to be etched respectively.

Figure 5:
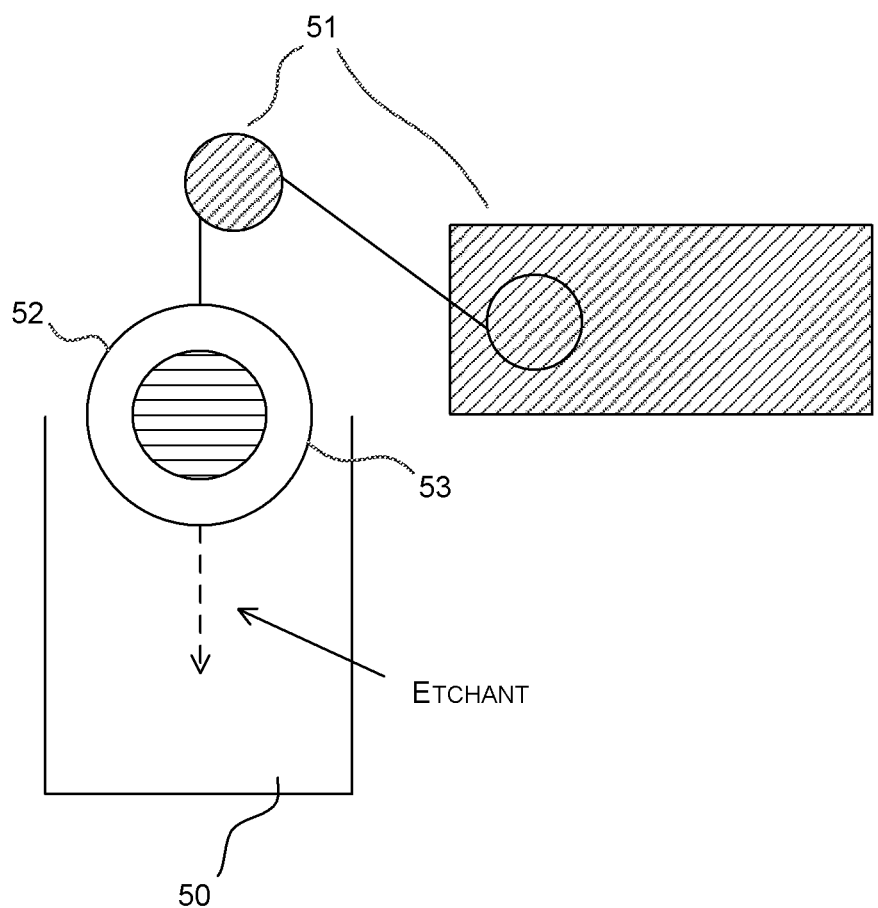
FIG. 5 shows a schematic diagram of an example etching apparatus.

FIG. 5 shows a schematic diagram of an example apparatus which may be utilised to implement the method described hereinbelow.

An etching vessel 50 (e.g. an etch tank) is provided for containing a liquid for etching a substrate. For example the vessel may be a conventional etch tank as known in the art and be used to contain conventional or proprietary etching liquids. Other apparatus typically associated with an etching system is also present as required, but is not shown for clarity.

A suspension apparatus 51 is provided to suspend a substrate 52 for etching within the vessel 50. The suspension apparatus 51 enables the height of the substrate within the vessel to be varied. In the specific example of FIG. 5 a winch system is provided utilising a wire to suspend the substrate. The wire is attached to the substrate at its distal end, and at its proximal end to a control system for extending and retracting the wire. A pulley arrangement may be utilised to guide the wire and support the substrate in the required location. As will be appreciated any appropriate mechanical and control system may be utilised and in other examples, the substrate 52 may not be suspended but may be otherwise supported or held in place and moved into and out of the etchant (in the etching vessel 50) and in such examples, the suspension apparatus 51 may be replaced by an alternative substrate support or mounting apparatus. The suspension, or mounting apparatus, enables the gradual movement of the substrate along an axis, which may be in the plane of the substrate, into and out of the etchant.

The substrate has a etch resist mask 53 (e.g. in the form of an oxide layer) deposited on one or more surfaces such that areas to be etched are exposed to the etchant upon placement in the vessel, and areas not to be etched are protected from the etchant by the mask, as is known in the art.

Figure 6:
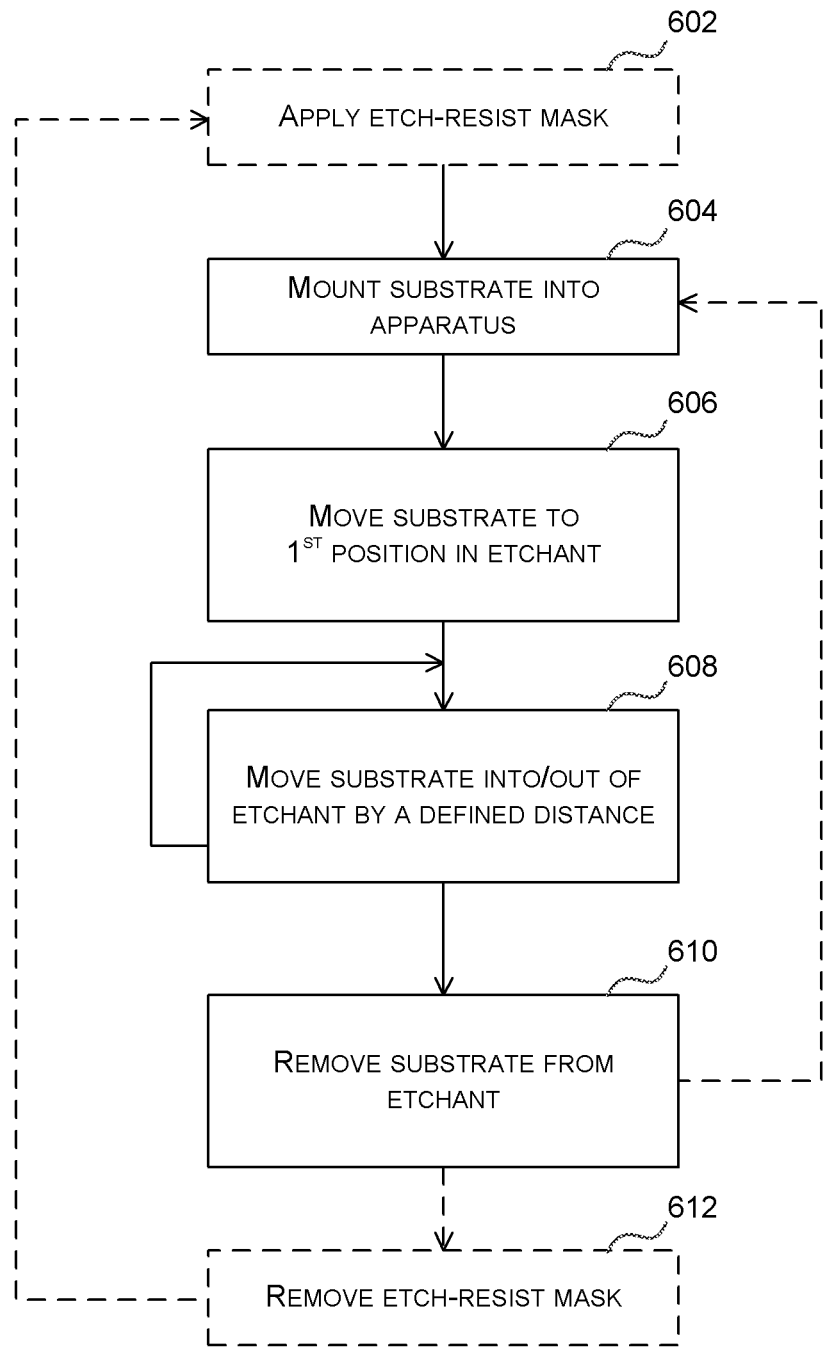
FIG. 6 shows a flow chart of an etching method.
Figure 10:
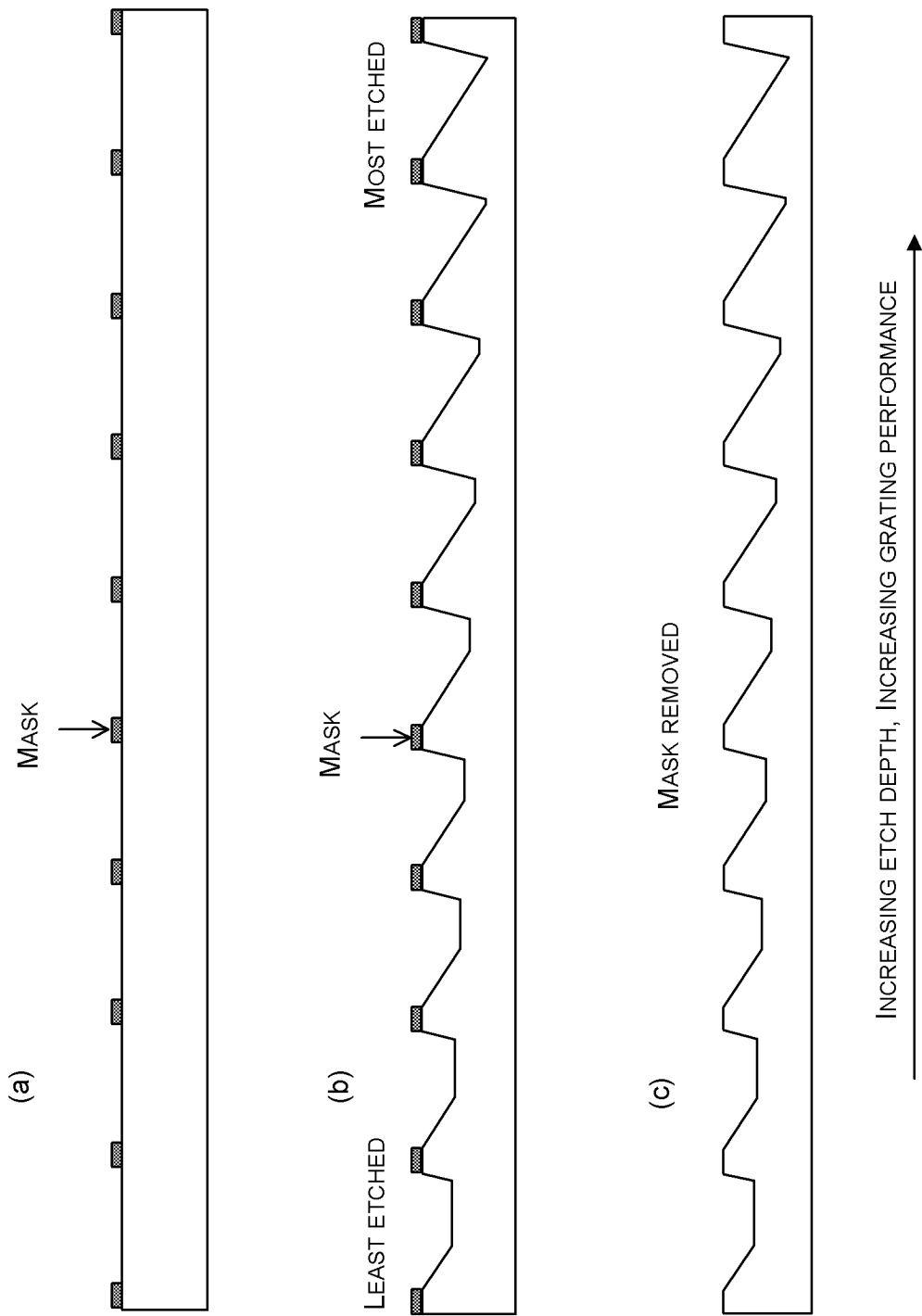
FIG. 10 shows example steps from the etching method of FIG. 6.

FIG. 6 shows a flow chart of a method of etching using the apparatus of FIG. 5 and this can be described with reference to the two examples shown in FIGS. 7 and 8 and with reference to FIG. 10.

Prior to the etching, an etch-resist mask is applied to the substrate to be etched (block 602, FIG. 10a) and this may be applied in the conventional manner. This application of the etch-resist mask may be part of the method or alternatively, pre-coated substrates (i.e. with the etch-resist mask already applied) may be received. In various examples a constant linewidth mask is utilised as is known in the art for producing constant efficiency gratings. Since this mask is regular no special techniques are required for its production. In other examples, a different mask may be used to create other surface relief features and in various examples the mask may not have constant linewidth and/or constant pitch. In various examples, the mask may define openings (i.e. areas for etching) that are all rectangular and in other examples, the openings may be of different (or varying) shape.

The substrate is mounted in or above the etching vessel 50 (e.g. suspended by the suspension apparatus 51 in or above the etching vessel 50), but not within the etchant. In the orientation shown in the examples of FIGS. 7 and 8, the substrate is mounted above the surface 702 of the etchant 704. The substrate is mounted (e.g. suspended) such that the areas which require more etching are positioned closest to the etchant. For example, the mask layout and suspension arrangement may be such that the end of an optical grating to be formed with higher efficiency are closest to the etchant.

The substrate is then moved (e.g. lowered) to a first position, P1, in the etchant (block 606) and etching of the areas of the substrate exposed to the etchant commences. The time at which the substrate is first moved into the etchant is denoted time, t=0, in FIGS. 7 and 8. Depending upon the implementation, in the first position only part of the overall area to be etched (i.e. not the entirety of the overall area to be etched) may be exposed to the etchant (e.g. as in FIG. 7) or all of the area to be etched may be exposed to the etchant (e.g. as in FIG. 8).

After a predetermined time (e.g. m or n in FIGS. 7 and 8), the position of the substrate in the etchant is changed, e.g. to a second position, P2, in the etchant (block 608). This comprises moving the substrate into or out of the etchant by a predefined amount, such that a different proportion (or portion) of the substrate is exposed to the etchant. The example in FIG. 7 shows the substrate being moved further into the etchant (i.e. such that more of the substrate is exposed to the etchant) and the example in FIG. 8 shows the substrate being moved further out of the etchant (i.e. such that less of the substrate is exposed to the etchant). In various examples, the motion of the substrate will be along a defined axis 706 that is in the plane of the substrate and substantially perpendicular to the surface of the etchant 702 (e.g. the axis is defined by the suspension apparatus 51 in FIG. 5) such that the motion of the substrate (in block 608) is into or out of the etchant, instead of laterally within the etchant.

Figure 7:
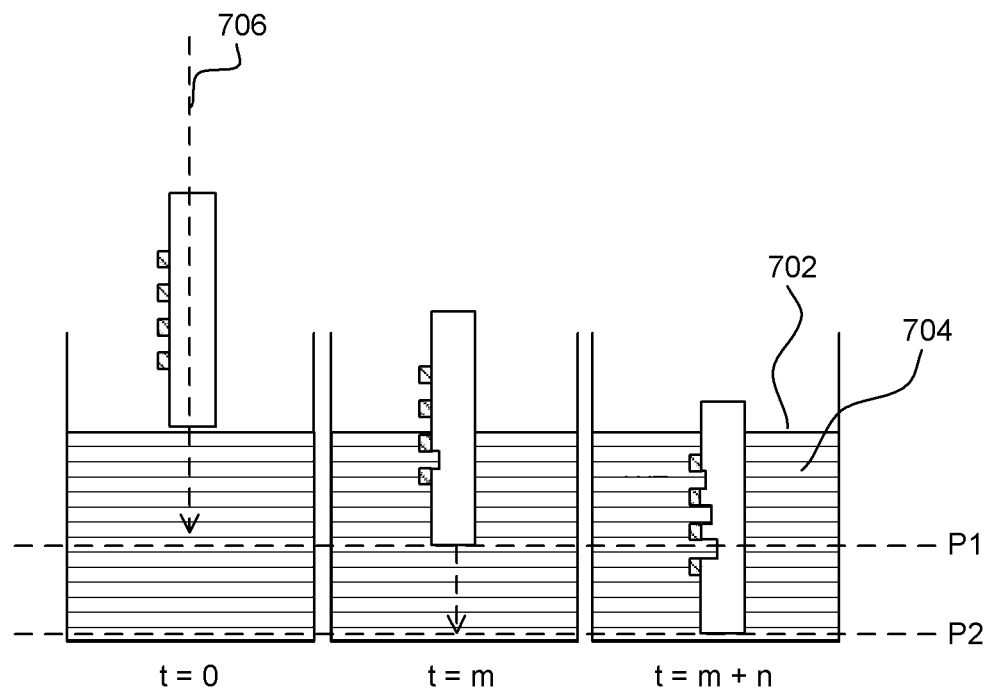
FIGS. 7 and 8 show example steps from the etching method of FIG. 6.
Figure 8:
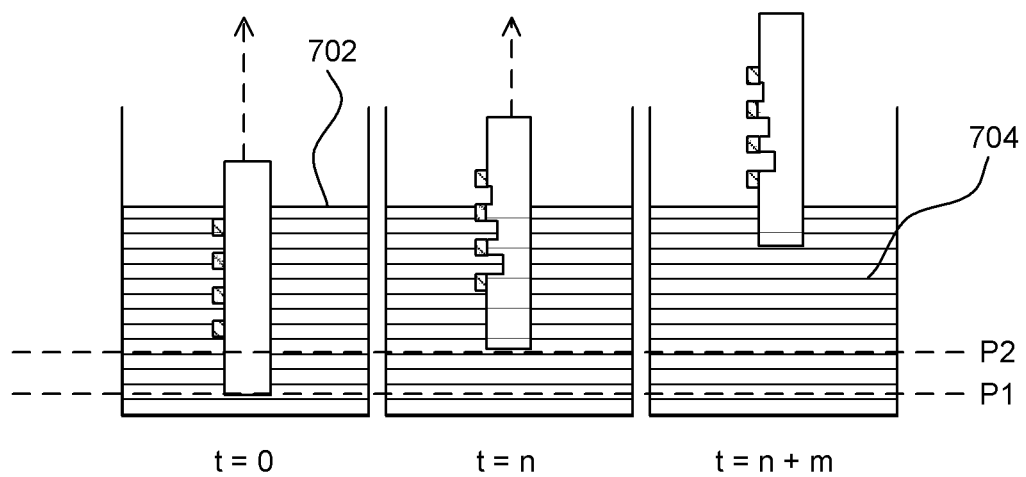

In various examples, as shown in FIG. 7, in the first position, P1, only a part of the overall area to be etched is exposed to the etchant and the substrate is then lowered further into the etchant such that more of the area to be etched is exposed the etchant. Etching then commences to the newly exposed area, and continues at the previously exposed areas (which are now deeper within the etchant). In other examples, as shown in FIG. 8, where the movement of the substrate (in block 608) moves the substrate partially out of the etchant (whilst still leaving a portion of the substrate exposed to the etchant), etching continues on the exposed areas and stops on those areas which are no longer exposed to the etchant.

The repositioning of the substrate in the etchant (in block 608), by moving the substrate by a predefined amount (and at a predefined time) into or out of the substrate, may be repeated multiple times (as indicated by the arrow from block 608 back to block 608 in FIG. 6). For example, the substrate may be incrementally lowered into the etchant until the whole area to be etched is exposed or incrementally raised out of the etchant until none of the substrate is exposed to the etchant. Once etching is complete, the substrate is removed from the etchant (block 610) and processed in the normal manner (e.g. including removal of the etch-resist mask, block 612). FIG. 10b shows an example substrate following removal from the etchant (in block 610) and FIG. 10c shows the same example substrate following removal of the etch-resist mask (in block 612).

The result of the process of FIG. 6 is that different areas of the substrate (or of the area to be etched) are exposed to the etchant for different amounts of time and are therefore etched by different amounts, i.e. there is a variation in etch depth across the substrate, as shown in the examples in FIG. 9 (described below). Where the surface relief structure being formed is an optical grating, the axis of optical grating may be aligned with the axis of movement of the substrate into the etching fluid 706 and hence a graded depth of grating features is achieved along the grating and hence a graded efficiency. This is achieved without the need for non-conventional masks or specific processing techniques. A graded efficiency grating can thus be provided without significant additional complexity.

By varying the time intervals (e.g. m and n in FIGS. 7 and 8) between each repositioning of the substrate (in block 608) and/or by varying the amount by which the substrate is moved, the etch depth variation across the substrate (and hence across the surface relief structure) can be accurately controlled. In various examples, a linear depth profile may be obtained and in other examples a non-linear (e.g. polynomial) depth profile may be obtained.

Figure 11:
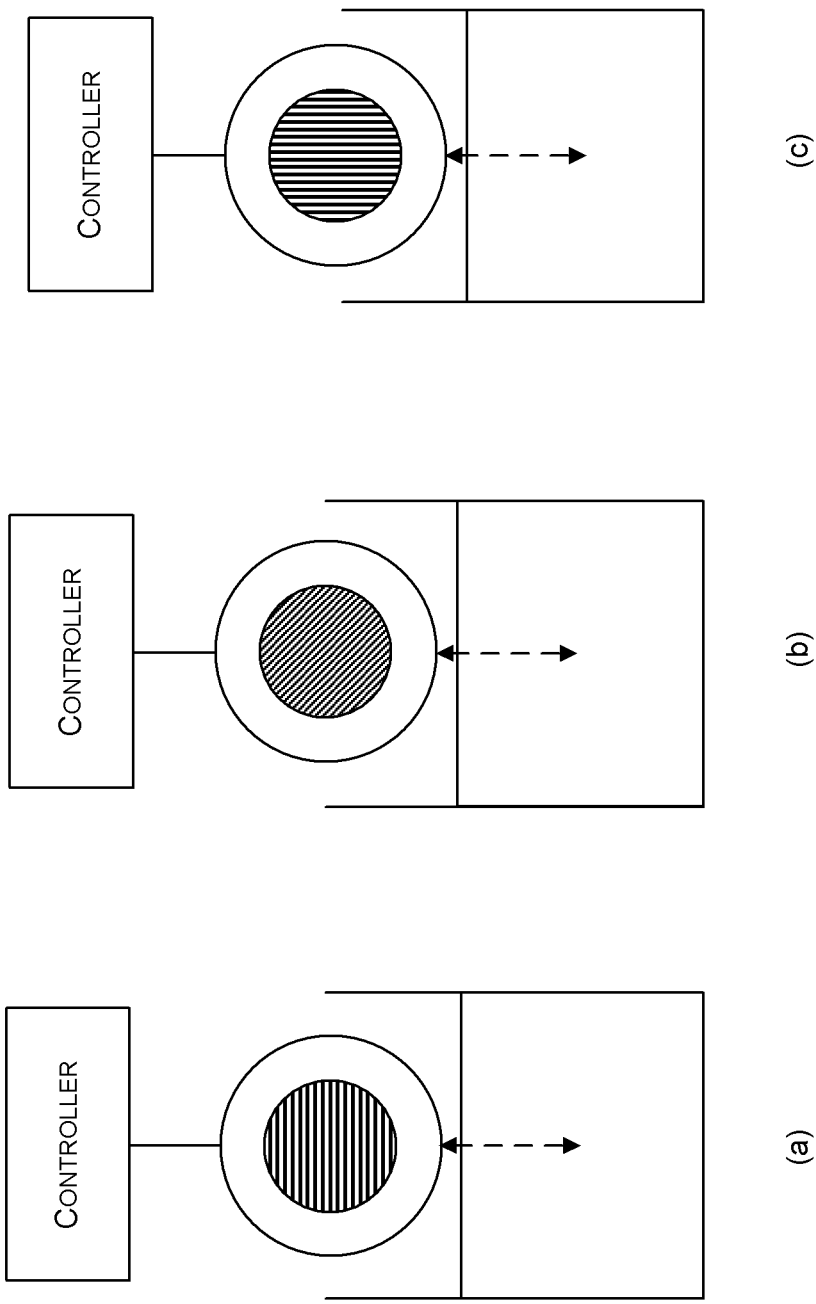
FIG. 11 shows three examples of a substrate mounted in different orientations in an example etching apparatus.

The depth profile across the area to be etched may also be controlled by controlling the angle at which the substrate is moved into and/or out of the etchant with respect to the features on the etch-resist mask and three examples are shown in FIG. 11. This control of the angle may be achieved by mounting the substrate with the appropriate orientation into the apparatus (in block 604). FIG. 11a shows an example arrangement in which the movement into/out of the etchant is orthogonal to the lines in the etch-resist mask that form the etched facets. FIG. 11b shows an example arrangement shows an example arrangement in which the movement into/out of the etchant is angularly offset to the lines in the etch-resist mask that form the etched facets. FIG. 11c shows an example arrangement shows an example arrangement in which the movement into/out of the etchant is parallel to the lines in the etch-resist mask that form the etched facets.

In various examples, for example to create more complex variations in etch depth across the substrate (e.g. U or V shaped depth profiles, where there is an inflection in the etch depth across the substrate), having removed the substrate from the etchant (in block 610), the substrate may then be remounted on the apparatus in a different orientation (in block 604) and the method repeated (e.g. as indicated by the dotted arrow from block 610 to block 604 in FIG. 6). In this example, both (or all) passes of the method of FIG. 6 use the same etch-resist mask and hence result in the etching of the same areas of the substrate. In other examples, however, the method may involve removing the first etch-resist mask (in block 612) and applying a second, different etch-resist mask (in block 602) before repeating the etch process described above (e.g. as indicated by the dotted arrow from block 612 to block 602 in FIG. 6).

In the examples above, it is assumed that the properties of the etchant 704 are substantially constant throughout the body of the etchant. In other examples, however, the properties of the etchant may vary within the etching vessel 50, e.g. there may be a temperature gradient within the etching vessel 50 that results in the etching characteristics of the etchant (e.g. the etch rate) varying within the etching vessel 50. In further examples, the etchant may be differentially agitated within the etching vessel 50 such that the etching characteristics of the etchant (e.g. the etch rate) vary within the etching vessel 50.

The resulting surface relief structure on the substrate (which may, for example, be a silicon master grating) may then be replicated and, where needed, coated (with a uniform thickness) to provide multiple optical components (e.g. multiple gratings) for use.

As described above, the movement of the substrate may comprise a series of discrete steps, with the size of the steps and/or the time between them defined as required to etch the desired profile. For example constant step and/or time gaps may be utilised, or variable step and/or time gaps may be utilised. Also, the movement may be continuous, rather than discrete steps, and can progress at any constant or variable speed. Controlling the rate of movement of the substrate thus allows any desired etch depth profile to be created, thus allowing the creation of optimum efficiency profiles as required for applications. Even complex profiles may, in various examples, still utilise a conventional linear mask. The movement of the substrate into the etchant thus defines the etching profile required.

Figure 9:
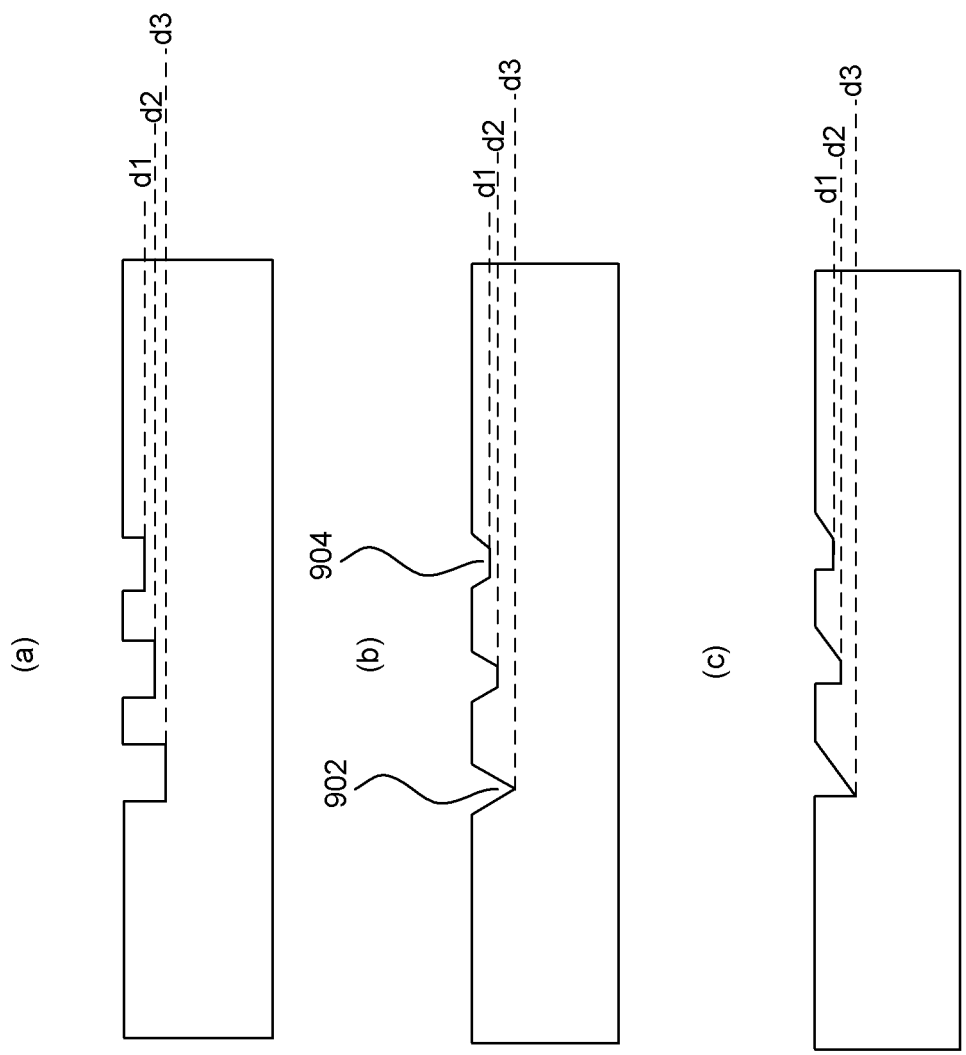
FIG. 9 shows three example surface relief structures formed using the apparatus of FIG. 5 and/or the method of FIG. 6.

FIG. 9 shows schematic diagrams of three example etched substrates where the substrate is formed from a crystalline material such as silicon and the etch preferentially etches some planes within the crystal. The first example, shown in FIG. 9a, shows binary grooves (e.g. which may be formed in non-crystalline substrates). The second example, shown in FIG. 9b, shows v-shaped grooves, although as shown in FIG. 9b, dependent upon the line width of the openings in the etch-resist mask and the etch times used, some of the etched features may etch to termination (e.g. as shown by the v-shaped groove 902) and other features may not etch to termination (e.g. as shown by the more u-shaped features 904). The third example, shown in FIG. 9c, shows blazed grooves, which may, for example, be achieved through use of an appropriate off-axis crystalline substrate. Use of such blazed grooves may further enable the tailoring of the surface relief structure to improve diffraction efficiency (e.g. where the surface relief structure formed is a blazed optical grating). It will be appreciated that the shape of the etched regions will be dependent on the substrate material and the choice of etchant as well as the etch depth. In all examples, there is a variation in the etch depth of the etched features across the substrate (e.g. $d_1 < d_2 < d_3$). The use of an anisotropic etchant may improve the formation of the blazed structure allowing such a structure to be formed from a blank or un-etched substrate.

An un-etched substrate may refer to a substrate that has a substantially flat surface. An un-etched or blank substrate may be cleaned prior to etching, for example to remove contaminants or oxide layers.

The surface relief structures formed by the methods described herein (e.g. as shown in FIG. 6) may form many different types of optical elements, including optical gratings, optical facets and optical mirror arrays, etc. As noted above, the resultant structure may not itself be used as an optical element but may be used as a master to form (e.g. via moulding) a plurality of copies that are then used as optical elements. The optical elements may themselves then form part of a HUD, HMD or other head-worn device. The method described above may, for example, be used to generate a variable efficiency optical grating that may be used to improve the uniformity of intensity output over the length of the grating. In examples where the surface relief structure results in an array of mirrored facets operating in reflection, the variation in etch depth results in a variation in sampling of incident light (e.g. as a consequence of the differing lengths of the mirror facets).

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality. In the claims, the term 'comprising' or "including" does not exclude the presence of other elements.

The invention claimed is:

1. A method of etching a blazed surface relief structure in a substrate, the method comprising:
   moving the substrate between a first position and a second position in an etching system, wherein in the first position only a first part of the area to be etched is exposed to an etchant, wherein the etchant is an anisotropic etchant, and in the second position the area to be etched is exposed to the etchant such that the first part of the area to be etched is exposed to the etchant for a longer period of time than at least one other part of the area to be etched, and wherein the movement is defined according to an etching profile, both the movement of the substrate and an orientation of the substrate are relative to a surface of the etchant defined according to the etching profile; and
   removing the substrate from the etchant when etching is complete;
   wherein the surface relief structure comprises a variable depth etching profile.

2. The method according to claim 1, wherein moving the substrate between the first position and the second position in the etching system comprises either moving the substrate from the first position to the second position or moving the substrate from the second position to the first position.

3. The method according to claim 1, wherein the etchant includes a fluid.

4. The method according to claim 1, wherein prior to moving the substrate between the first position and the second position, the method comprises: preparing the substrate with an etch-resist mask.

5. The method according to claim 4, wherein after removing the substrate from the etchant, the method comprises: removing any remaining etch-resist mask from the substrate.

6. The method according to claim 1, wherein the movement between the first position and the second position is along an axis substantially perpendicular to a surface of the etchant.

7. The method according to claim 1, wherein the etching profile is a non-linear profile.

8. The method according to claim 1, wherein the movement between the first position and the second position comprises a series of discrete steps.

9. The method according to claim 8, wherein the time between each step is variable.

10. The method according to claim 1, wherein the movement between the first position and the second position comprises a continuous movement.

11. The method according to claim 1, wherein the surface relief structure is an optical grating.

12. The method according to claim 11, wherein an axis of movement between the first position and the second position is aligned with an axis of the grating.

13. The method according to claim 1, wherein the surface relief structure is an array of facets.

14. The method according to claim 1, wherein a resulting structure with the surface relief structure is an optical master.

15. The method according to claim 1, wherein the substrate is a substrate formed of a crystalline material.

16. The method according to claim 1, wherein the substrate is an off-axis silicon wafer.

17. The method according to claim 1, wherein moving the substrate between the first position and the second position in the etching system is the first time the substrate is etched, such that the substrate is un-etched immediately prior to moving the substrate between a first position and a second position in the etching system.

18. A method of etching a nanostructure-based surface relief structure in a substrate, the method comprising:
   moving the substrate between a first position and a second position in an etching system, wherein in the first position only a first part of the area to be etched is exposed to an anisotropic etch process, and in the second position at least one other part of the area to be etched is exposed to the anisotropic etch process such that the first part of the area to be etched is etched for a longer period of time than the at least one other part of the area to be etched, and wherein the movement is defined according to an etching profile, both the movement of the substrate and an orientation of the substrate are relative to a surface of the etchant defined according to the etching profile; and
   in response to the anisotropic etch process being complete, removing the substrate from the anisotropic etch process;
   wherein the surface relief structure comprises a variable depth etching profile;
   wherein moving the substrate between the first position and the second position in the etching system comprises either moving the substrate from the first position to the second position or moving the substrate from the second position to the first position.

* * * * *